SUPPLY-VOLTAGE DRIVER FOR A DIFFERENTIAL AMPLIFIER
Filed Oct. 25, 1968
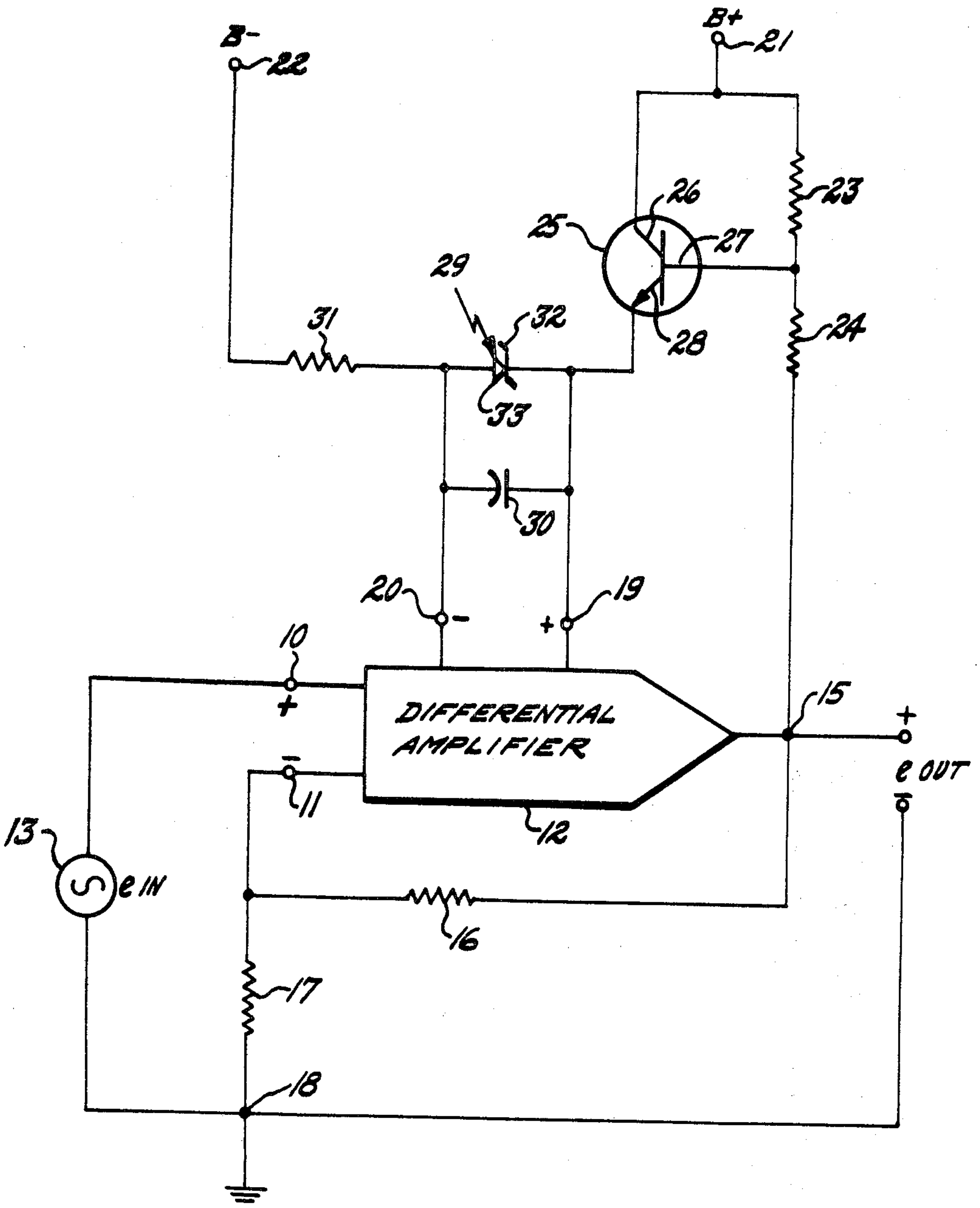
INVENTOR.
JOHN D. RUDOLPH
BY Harry A. Herbert Jr
and
George Fine
ATTORNEYS United States Patent Office 3,530,396
Patented Sept. 22, 1970

3,530,396

SUPPLY-VOLTAGE DRIVER FOR A DIFFERENTIAL AMPLIFIER

John D. Rudolph, Inglewood, Calif., assignor to the United States of America as represented by the Secretary of the Air Force Filed Oct. 25, 1968, Ser. No. 770,689
Int. Cl. H03f 1/30, 5/00
U.S. Cl. 330—69 5 Claims

ABSTRACT OF THE DISCLOSURE

A supply-voltage driver apparatus for differential amplifiers to provide supply voltages which track the amplifier's output and thereby giving the amplifier an increase in its limits on common-mode voltage input.

BACKGROUND OF THE INVENTION

The best known prior art was to stay within the limits of common-mode voltage into the amplifier. Additionally, prior art devices were unable to utilize integrated circuit amplifiers for differential amplifier applications for performance similar to discrete circuit amplifiers without the use of additional discrete component protective circuitry in the signal's path. These prior art devices, which attenuated the input signal levels prior to application to the amplifier to bring it back up to its proper level, required the use of resistors which add substantial capacitance and tolerance problems to the overall circuit function. The present invention provides a method of indirect feedback which is substantially less critical.

SUMMARY OF THE INVENTION

A differential amplifier has limits on the maximum positive or negative common-mode voltage applied to its inputs. The present invention provides the necessary means for the supply voltages to track the differential amplifier's output signal, thus increasing the limits on the common-mode voltage input to the differential amplifier.

It is one object of the invention to provide a supply voltage driver apparatus for a differential amplifier providing the means to directly apply input signals to integrated circuit differential amplifiers substantially greater than the limits on the maximum common-mode voltage input.

It is another object to provide a supply voltage driver apparatus for a differential amplifier providing the means to apply input signals to integrated circuit differential amplifier directly without the use of attenuating means, such as resistors.

These and other advantages, features and objects of the invention will become more apparent from the following description taken in connection with the illustrative embodiment in the accompanying drawing, wherein the figure is a schematic diagram of the supply voltage driver for an integrated circuit differential amplifier.

Referring to the single figure in more detail, there is shown an integrated circuit differential amplifier 12 having a first input terminal 10 and a second input terminal 11. The input signal from source 13 is connected to first input terminal 10. The output signal of integrated circuit differential amplifier 12 appears at output terminal 15. A feedback network which is comprised of resistors 16 and 17 is connected between output terminal 15 and ground point 18. The second input terminal 11 of differential amplifier 12 is connected to the junction of resistors 16 and 17. The positive supply voltage for amplifier 12 is applied at terminal 19 and the negative supply voltage is applied at terminal 20.

The supply voltage driver consists of resistors 23, 24, 31, transistor 25, Zener diode 29 and capacitor 30. The positive supply voltage B+ is applied at terminal 21 which is connected to the collector 26 of transistor 25 and resistor 23. Resistors 23 and 24 form a voltage divider network to provide the bias signal to transistor 25. The base 27 of transistor 25 is connected to the junction of resistors 23 and 24. The lower end of resistor 24 is connected to output terminal 15. Transistor 25 is operated in the emitter follower configuration and emitter 28 is connected in series with Zener diode 29 and resistor 31 to terminal 22 which is the negative supply voltage B—. Capacitor 30 is connected in parallel across Zener diode 29. The common junction of resistor 31, Zener diode 29 and capacitor 30 is connected to terminal 20. Terminal 19 is connected to the common junction of Zener diode 29, emitter 28 and capacitor 30. Resistor 31 provides a current sink for transistor 25. The output of the supply voltage driver is taken across the parallel combination of Zener diode 29 and its filter capacitor 30 and is applied to integrated circuit differential amplifier 12 at terminals 19, 20.

The mode of operation of the present invention will be more clearly understood with reference to the following analysis. Assume that differential amplifier 12 has a gain of A, then the closed loop gain is $$\frac{e_o}{e_{in}}=\frac{R16+R17}{R17+(1/A)(R16+R17)}$$

The expresesion for $(e_o/e_{in})$ may be further simplified as A increases without limit to give:

$$\frac{e_o}{e_{in}}=\frac{R_{16}+R_{17}}{R_{17}}=K$$

For the purposes of simplification, the following assumptions will be made: the dynamic impedance of Zener diode 29 will be considered small enough to be neglected (an ideal approached by the use of capacitor 30); transistor 25 will have a beta, $\beta$, which is greater than ten; and the base-emitter voltage on transistor 25 will always be zero. The first assumption states in effect that the AC component of the voltage appearing at terminal 19 is identical to the AC component appearing at terminal 20. Thus the voltage between terminals 19 and 20 is DC. The second assumption states that the impedance ($\beta R_{31}$) is large enough so that it does not materially effect the parallel impedance of $R_{23}$ and $R_{24}$ and it then is practical to express the voltage at the base 27 of transistor 25 as a function of $R_{23}$ and $R_{24}$ only. The third assumption states that the voltage at base 27 of transistor 25 is equal to the voltage at emitter 28, which eliminates an unimportant term from the equation expressing the voltage at the emitter. This voltage is also the positive-supply voltage, $Vps$, for the differential amplifier 12, and is given by the expression $$Vps=\frac{e_{in}KR_{23}}{R_{23}+R_{24}}+\frac{ER_{24}}{R_{23}+R_{24}}=f(e_{in})$$

where E is the value of B+ power source to the supply-voltage driver. It is to be noted that the notation $R_{23}$ is a shorthand form for resistor 23 and is used for all the resistors involved in the present analysis. The negative supply voltage $Vns$ which is applied to differential amplifier 12 at terminal 20 may be defined as $$Vns=Vps-e_d=g(e_{in})$$

where $e_d$ is the voltage across the Zener diode 29 which is measured with the cathode 32 taken as positive with respect to the anode 33.

With $Vns$ and $Vps$ defined as above, the usefulness of the present invention becomes apparent. Since the common-mode voltage which breaks down many differential amplifiers is a function of the voltage difference between $e_{in}$ and the voltage at terminal 19 or terminal 20 and since the voltages at terminals 19 and 20 in the present invention track $e_{in}$, it is apparent that the present invention modifies the manufacturer's common-mode specification $Ecm$. Specifically let the modified specification be $E'cm$. Then $$E'cm = Ecm + \frac{e_{in}KR_{23}}{R_{23}+R_{24}}$$

since both $Vps$ and $Vns$ are simultaneously shifted by the amount $$\frac{e_{in}KR_{23}}{R_{23}+R_{24}}$$

Although the invention has been described with reference to a particular embodiment, it will be understood to those skilled in the art that the invention is capable of a variety of alternative embodiments within the spirit and scope of the appended claims.

What is claimed is:

1. A supply voltage driver comprising in combination:

a differential amplifier having a first and a second input terminal, an output terminal, and a positive and negative supply voltage terminals, said differential amplifier having a feedback network connected between said output terminal and said second input terminal, a signal source for applying input signals to said differential amplifier, said signal source being connected to said first input terminal, a first potential source, a second potential source, a voltage divider means connected between said output terminal and said first potential source, having first and second resistors therein, and providing a control signal at the junction of said first and second resistors, current control means being connected to said first potential source and to the junction of said first and second resistors of said voltage divider means, thereby receiving said control signal, said current control means being responsive to said control signal and providing an electric current which varies according to said control signal, voltage reference means connected to said positive and negative supply voltage terminals of said differential amplifier, said voltage reference means being connected to said current control means and receiving said electric current from said current control means, said voltage reference means providing a voltage signal corresponding to said electric current, filter means connected across said voltage reference means, and resistor means connected between said voltage reference means and said second potential source to provide a return path for said electric current to said second potential source.

2. A supply voltage driver as defined in claim 1 wherein said differential amplifier is of the integrated circuit type.

3. A supply voltage driver as defined in claim 1 wherein said voltage reference means is a Zener diode.

4. A supply voltage driver as defined in claim 1 wherein said filter means is a capacitor filter.

5. A supply voltage driver as defined in claim 1 wherein said control means is a transistor utilized in an emitter follower configuration.

References Cited

UNITED STATES PATENTS 3,356,961 12/1967 Sedlmeyer ---------- 330—69

NATHAN KAUFMAN, Primary Examiner

U.S. Cl. X.R.

330—3, 24, 199